United States Patent
Shimazaki

(10) Patent No.: US 9,054,662 B2
(45) Date of Patent: Jun. 9, 2015

(54) AUTOMATIC AUDIO SIGNAL LEVEL ADJUSTMENT CIRCUIT

(75) Inventor: Koya Shimazaki, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 349 days.

(21) Appl. No.: 13/331,282

(22) Filed: Dec. 20, 2011

(65) Prior Publication Data

US 2012/0163631 A1 Jun. 28, 2012

(30) Foreign Application Priority Data

Dec. 22, 2010 (JP) .................. 2010-285711

(51) Int. Cl.
*H03G 3/00* (2006.01)
*H03G 7/00* (2006.01)

(52) U.S. Cl.
CPC ..................... *H03G 7/002* (2013.01)

(58) Field of Classification Search
CPC ....... H03F 3/68; H03F 2200/03; H03F 3/181; H03F 3/217; H03F 3/72; H03G 3/225; H03G 3/301; H03G 3/3026; H03G 11/00; H03G 11/006; H03G 11/08; H03G 2201/103; H03G 2201/106; H03G 2201/202; H03G 2201/302; H03G 2201/508; H03G 2201/603; H03G 2201/606; H03G 3/001; H03G 3/32; H03G 3/3005; H03G 3/3089; H03G 7/007
USPC .............. 381/28, 57, 321, 84, 94.8, 101, 102, 381/103, 104, 107, 108, 120, 121, 123; 379/388.03, 395, 390.01, 390.03; 455/136, 138, 219, 239.1, 240.1, 455/245.1, 247.1, 250.1, 251.1; 700/94

See application file for complete search history.

(56) References Cited

U.S. PATENT DOCUMENTS

2002/0181724 A1* 12/2002 Jiang et al. .................... 381/106
2008/0008336 A1* 1/2008 Tanaka et al. ................. 381/104

FOREIGN PATENT DOCUMENTS

JP  2006-041734      2/2006
JP  2006041734 A  *  2/2006

\* cited by examiner

*Primary Examiner* — Leshui Zhang
(74) *Attorney, Agent, or Firm* — Kubotera & Associates, LLC

(57) ABSTRACT

An automatic audio signal level adjustment circuit is capable of automatically adjusting a level of an input audio signal within a specific range. The automatic audio signal level adjustment circuit includes an amplitude adjustment determining unit and an amplitude adjusting unit. The amplitude adjustment determining unit is configured to generate an amplitude reduction instruction when the level is greater than a first reference value, and an amplitude augmentation instruction when the level is small than a second reference value. The amplitude adjusting unit is configured to output an output audio signal having an amplitude reduced from that of the input audio signal upon the amplitude reduction instruction, and an output audio signal having an amplitude augmented from that of the input audio signal upon the amplitude augmentation instruction. Further, the amplitude adjusting unit is configured to output an output audio signal equal to the input audio signal upon no instruction.

7 Claims, 4 Drawing Sheets

AUTOMATIC AUDIO SIGNAL LEVEL ADJUSTMENT CIRCUIT

BACKGROUND OF THE INVENTION AND RELATED ART STATEMENT

The present invention relates to an automatic audio signal level adjustment circuit capable of automatically adjusting a level of an input audio signal within a specific range.

Patent Reference has disclosed a conventional automatic audio signal level adjustment circuit. According to Patent Reference, the conventional automatic audio signal level adjustment circuit is configured to automatically decrease a gain of a variable amplifier when a level of an input audio signal is below a specific reference level. Further, the conventional automatic audio signal level adjustment circuit is configured to automatically increase the gain of the variable amplifier when the level of an input audio signal is above the specific reference level (refer to Patent Reference).

Patent Reference: Japanese Patent Publication No. 2006-041734

However, in the conventional automatic audio signal level adjustment circuit disclosed in Patent Reference, when the level of the input audio signal tends to fluctuate near the specific reference level, it is necessary to frequently switch from increasing the gain to decreasing the gain, or from decreasing the gain to increasing the gain, thereby causing a noise.

In view of the problems described above, an object of the present invention is to provide an automatic audio signal level adjustment circuit capable of solving the problems of the conventional automatic audio signal level adjustment circuit. In the present invention, it is possible to automatically adjust a level of an audio signal within a specific range while being capable of minimizing a noise.

Further objects and advantages of the invention will be apparent from the following description of the invention.

SUMMARY OF THE INVENTION

In order to attain the objects described above, according to an aspect of the present invention, an automatic audio signal level adjustment circuit is capable of automatically adjusting a level of an input audio signal within a specific range. The automatic audio signal level adjustment circuit includes an amplitude adjustment determining unit and an amplitude adjusting unit.

According to the aspect of the present invention, the amplitude adjustment determining unit is configured to generate an amplitude reduction instruction when the level of the input audio signal is greater than a first reference value corresponding to a maximum value of the specific range. Further, the amplitude adjustment determining unit is configured to generate an amplitude augmentation instruction when the level of the input audio signal is small than a second reference value smaller than the first reference value by a specific value.

According to the aspect of the present invention, the amplitude adjusting unit is configured to output an output audio signal having an amplitude reduced from that of the input audio signal when the amplitude adjustment determining unit generates the amplitude reduction instruction. Further, the amplitude adjusting unit is configured to output an output audio signal having an amplitude augmented from that of the input audio signal when the amplitude adjustment determining unit generates the amplitude augmentation instruction. Further, the amplitude adjusting unit is configured to output an output audio signal equal to the input audio signal when the amplitude adjustment determining unit does not generate the amplitude reduction instruction or the amplitude augmentation instruction.

In the aspect of the present invention, the amplitude of the input audio signal is reduced when the level of the input audio signal is greater than the first reference value corresponding to the maximum value of the specific range, and the amplitude of the input audio signal is augmented when the level of the input audio signal is small than the second reference value smaller than the first reference value. Further, when the level of the input audio signal is small than the first reference value and greater than the second reference value, the amplitude of the input audio signal is not adjusted, and the input audio signal is output as is.

In the aspect of the present invention, the amplitude of the input audio signal is adjusted as described above. Accordingly, when the adjustment of the level of the input audio signal is switched from the reduction adjustment to the augmentation adjustment, or from the augmentation adjustment to the reduction adjustment, it is possible to create a period, in which the amplitude of the input audio signal is not adjusted. Accordingly, even when the switching occurs rapidly, it is possible to reduce noises thus generated.

DETAILED DESCRIPTION OF PREFERRED EMBODIMENTS

Hereunder, preferred embodiments of the present invention will be explained with reference to the accompanying drawings.

In an embodiment of the present invention, an automatic audio signal level adjustment circuit is capable of adjusting an amplitude of an input audio signal so that a level of the input audio signal is automatically within a specific range. In the first step of the adjustment, the automatic audio signal level adjustment circuit is configured to compare the level of the input audio signal with a first reference value corresponding to a maximum value of the specific range and a second reference value smaller than the first reference value by a specific value, respectively.

In the embodiment, the automatic audio signal level adjustment circuit is configured to adjust the level of the input audio signal such that the amplitude of the input audio signal is reduced when the level of the input audio signal is greater than the first reference value, and the amplitude of the input audio signal is augmented when the level of the input audio signal is small than the second reference value. Further, when the level of the input audio signal is small than the first reference value and greater than the second reference value, the amplitude of the input audio signal is not adjusted, and the input audio signal is output as is.

Figure 1:
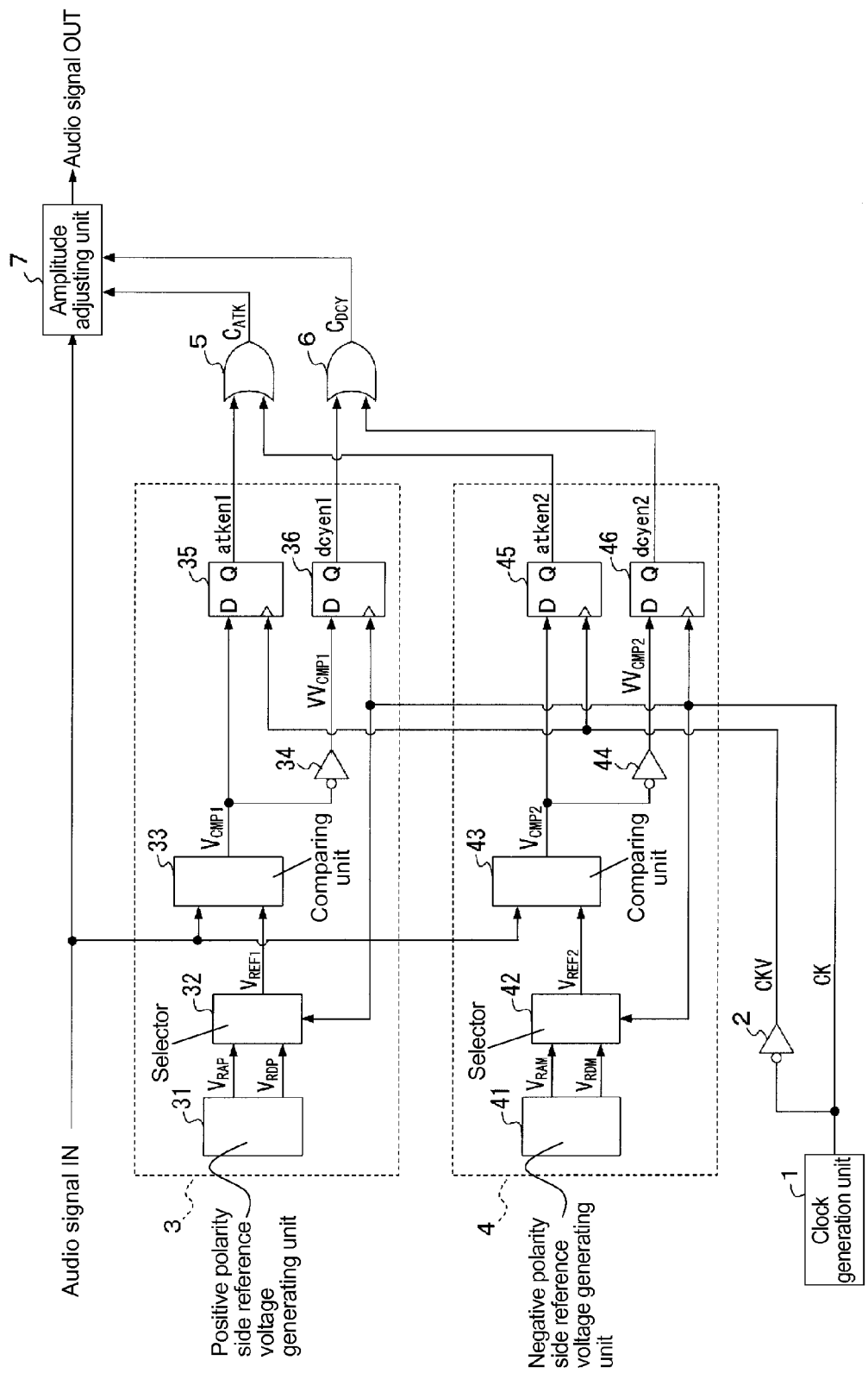
FIG. 1 is a circuit diagram showing a configuration of an automatic audio signal level adjustment circuit according to an embodiment of the present invention.
Figure 2:
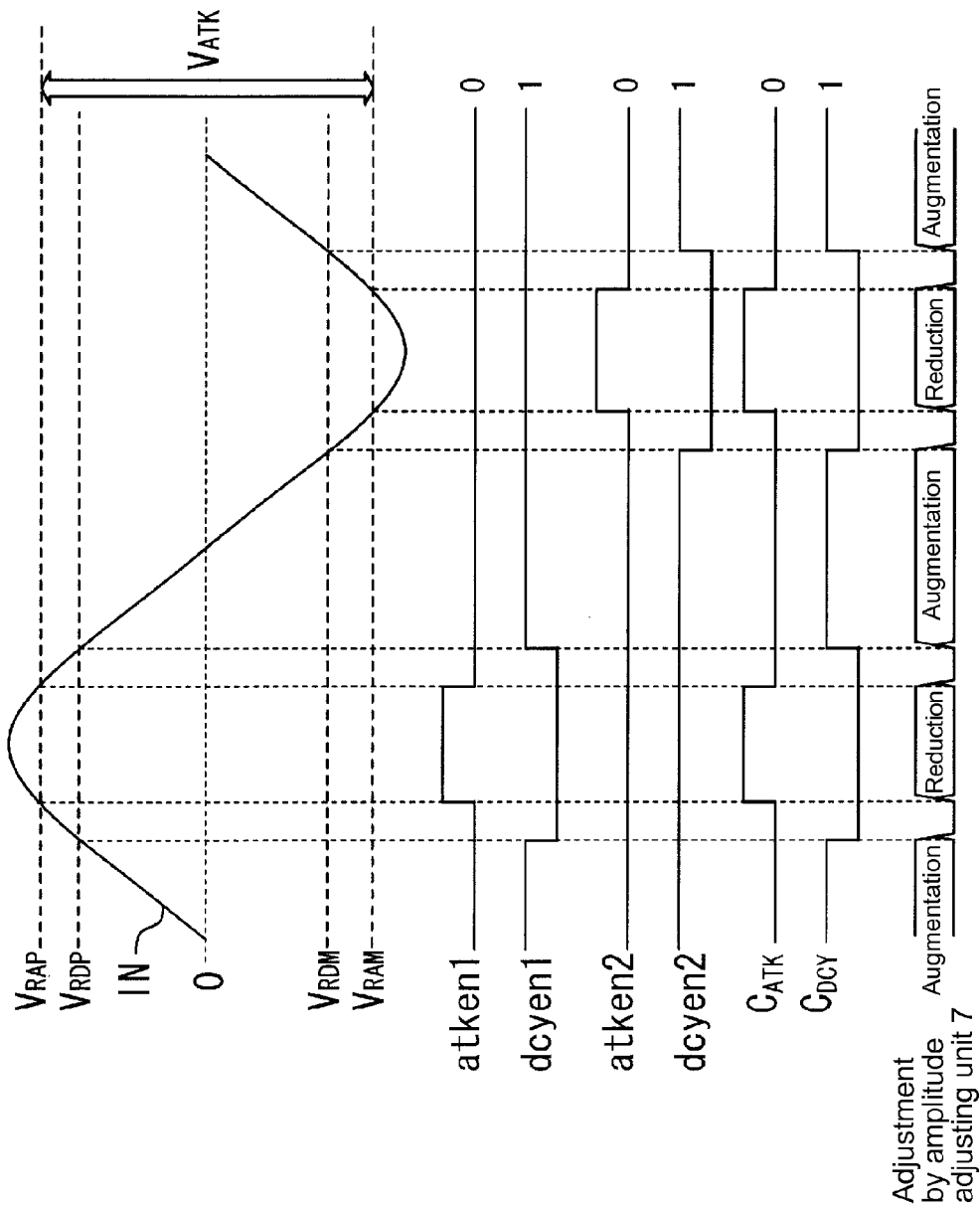
FIG. 2 is a time chart No. 1 showing an operation of the automatic audio signal level adjustment circuit according to the embodiment of the present invention.

FIG. 1 is a circuit diagram showing a configuration of the automatic audio signal level adjustment circuit according to the embodiment of the present invention. FIG. 2 is a time chart No. 1 showing an operation of the automatic audio signal level adjustment circuit according to the embodiment of the present invention.

As shown in FIG. 2, the automatic audio signal level adjustment circuit is configured to adjust an amplitude of an input audio signal IN, so that a level of the input audio signal IN is automatically within a specific amplitude adjustment range VATK.

As shown in FIG. 1, the automatic audio signal level adjustment circuit includes a clock generation unit 1; an inverter 2; a positive polarity side adjustment determining unit 3; a negative polarity side adjustment determining unit 4; a logic sum gate 5; a logic sum gate 6; and an amplitude adjusting unit 7.

Figure 3:
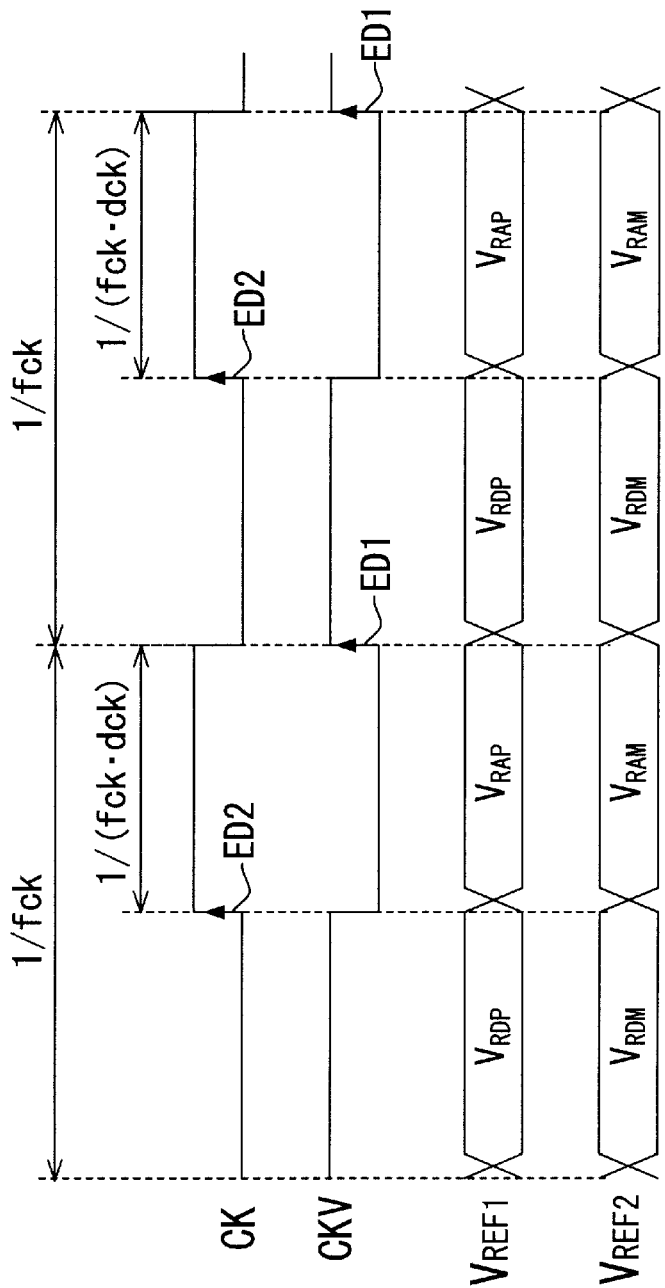
FIG. 3 is a time chart No. 2 showing the operation of the automatic audio signal level adjustment circuit according to the embodiment of the present invention.

FIG. 3 is a time chart No. 2 showing the operation of the automatic audio signal level adjustment circuit according to the embodiment of the present invention.

As shown in FIG. 3, the clock generation unit 1 is configured to generate a clock signal CK having a frequency number fck and a duty ratio dck (for example, 50%). Further, the clock generation unit 1 is configured to supply the clock signal CK to the inverter 2, the positive polarity side adjustment determining unit 3, and the negative polarity side adjustment determining unit 4, respectively. It is noted that the frequency number fck may be, for example, 500 KHz that is higher than a highest range of an audio signal.

As shown in FIG. 3, the inverter 2 is configured to generate an inverted clock signal CKV that is an inverted signal of the clock signal CK. Further, the inverter 2 is configured to supply the inverted clock signal CKV to the positive polarity side adjustment determining unit 3 and the negative polarity side adjustment determining unit 4, respectively.

As shown in FIG. 1, the positive polarity side adjustment determining unit 3 includes a positive polarity side reference voltage generating unit 31; a selector 32; a comparing unit 33; an inverter 34; a flip-flop 35 (referred to as an FF 35); and a flip-flop 36 (referred to as an FF 36).

As shown in FIG. 2, the positive polarity side reference voltage generating unit 31 is configured to generate an attack level VRAP as a reference voltage having a maximum level of the specific amplitude adjustment range VATK on a positive polarity side thereof. Further, the positive polarity side reference voltage generating unit 31 is configured to supply the attack level VRAP to the selector 32. Further, the positive polarity side reference voltage generating unit 31 is configured to generate a decay level VRDP as a reference voltage lower than the attack level VRAP by a specific value. Further, the positive polarity side reference voltage generating unit 31 is configured to supply the decay level VRDP to the selector 32.

In the embodiment, the selector 32 is configured to select one of the attack level VRAP and the decay level VRDP according to a logic level of the clock signal CK. Further, the selector 32 is configured to supply selected one of the attack level VRAP and the decay level VRDP as a comparison reference level VREF1 to the comparing unit 33.

More specifically, as shown in FIG. 3, when the clock signal CK is the logic level 1, the selector 32 is configured to supply the attack level VRAP as the comparison reference level VREF1 to the comparing unit 33. On the other hand, when the clock signal CK is the logic level 0, the selector 32 is configured to supply the decay level VRDP as the comparison reference level VREF1 to the comparing unit 33. In other words, the selector 32 is configured to alternately and repeatedly supply one of the attack level VRAP and the decay level VRDP to the comparing unit 33.

In the embodiment, the comparing unit 33 is configured to compare the level of the input audio signal IN with the comparison reference level VREF1. When the level of the input audio signal IN is greater than the comparison reference level VREF1, the comparing unit 33 is configured to supply a comparison result signal VCMP1 with the logic level 1 to the inverter 34 and the FF 35, respectively. When the level of the input audio signal IN is smaller than the comparison reference level VREF1, the comparing unit 33 is configured to supply a comparison result signal VCMP1 with the logic level 0 to the inverter 34 and the FF 35, respectively.

In the embodiment, as shown in FIG. 3, the FF 35 is configured to capture the comparison result signal VCMP1 at a timing of a rising edge portion ED1 of the inverted clock signal CKV. Further, the FF 35 is configured to supply the comparison result signal VCMP1 as an attack enable signal atken1 to the logic sum gate 5.

It is noted that the attack enable signal atken1 becomes an amplitude reduction instruction for performing the amplitude adjustment to reduce the amplitude only when the attack enable signal atken1 has the logic level 1. Accordingly, when the attack enable signal atken1 has the logic level 1, the amplitude adjusting unit 7 performs the amplitude adjustment to reduce the amplitude. On the other hand, when the attack enable signal atken1 has the logic level 0, the amplitude adjusting unit 7 does not perform the amplitude adjustment to reduce the amplitude.

In the embodiment, the inverter 34 is configured to generate an inverted comparison result signal VVCMP1 having the logic level that is an inverted logic level of the comparison result signal VCMP1, and supply the inverted comparison result signal VVCMP1 to the FF 36.

In the embodiment, as shown in FIG. 3, the FF 36 is configured to capture the inverted comparison result signal VVCMP1 at a timing of a rising edge portion ED2 of the clock signal CK. Further, the FF 36 is configured to supply the inverted comparison result signal VVCMP1 as a decay enable signal dcyen1 to the logic sum gate 6.

It is noted that the inverted comparison result signal VVCMP1 becomes an amplitude augmentation instruction for performing the amplitude adjustment to augment the amplitude only when the inverted comparison result signal VVCMP1 has the logic level 1. Accordingly, when the inverted comparison result signal VVCMP1 has the logic level 1, the amplitude adjusting unit 7 performs the amplitude adjustment to augment the amplitude. On the other hand, when the inverted comparison result signal VVCMP1 has the logic level 0, the amplitude adjusting unit 7 does not perform the amplitude adjustment to augment the amplitude.

In the embodiment, with the configuration described above, the positive polarity side adjustment determining unit 3 compares the level of the input audio signal IN on the positive polarity side thereof with the two reference values, namely, the attack level VRAP and the decay level VRDP in a time sequential manner. Accordingly, it is possible to determine whether the amplitude is to be augmented or reduced.

More specifically, when the level of the input audio signal IN on the positive polarity side thereof is greater than the attack level VRAP, the positive polarity side adjustment determining unit 3 determines that the amplitude of the input audio signal IN is to be reduced. Accordingly, the positive polarity side adjustment determining unit 3 supplies the attack enable signal atken1 with the logic level 1 to the logic sum gate 5, so that the amplitude adjustment is performed to reduce the amplitude. On the other hand, when the level of the input audio signal IN on the positive polarity side thereof is smaller than the decay level VRDP that is smaller than the attack level VRAP by the specific value, the positive polarity side adjustment determining unit 3 determines that the amplitude of the input audio signal IN is to be augmented. Accordingly, the positive polarity side adjustment determining unit 3 supplies the decay enable signal dcyen1 with the logic level 1 to the logic sum gate 6, so that the amplitude adjustment is performed to reduce the amplitude.

It is noted that when the level of the input audio signal IN on the positive polarity side thereof is smaller than the attack level VRAP and greater than the decay level VRDP, both the attack enable signal atken1 and the decay enable signal dcyen1 have the logic level 0.

In the embodiment, the negative polarity side adjustment determining unit 4 includes a negative polarity side reference voltage generating unit 41; a selector 42; a comparing unit 43; an inverter 44; a flip-flop 45 (referred to as an FF 45); and a flip-flop 46 (referred to as an FF 46).

As shown in FIG. 2, the negative polarity side reference voltage generating unit 41 is configured to generate an attack level VRAM as a reference voltage having a minimum level of the specific amplitude adjustment range VATK on a negative polarity side thereof. Further, the negative polarity side reference voltage generating unit 41 is configured to supply the attack level VRAP to the selector 42. Further, the negative polarity side reference voltage generating unit 41 is configured to generate a decay level VRDM as a reference voltage higher than the attack level VRAM by a specific value. Further, the positive polarity side reference voltage generating unit 31 is configured to supply the decay level VRDM to the selector 32.

In the embodiment, the selector 42 is configured to select one of the attack level VRAM and the decay level VRDM according to a logic level of the clock signal CK. Further, the selector 42 is configured to supply selected one of the attack level VRAM and the decay level VRDM as a comparison reference level VREF2 to the comparing unit 43. More specifically, as shown in FIG. 3, when the clock signal CK is the logic level 1, the selector 42 is configured to supply the attack level VRAM as the comparison reference level VREF2 to the comparing unit 43. On the other hand, when the clock signal CK is the logic level 0, the selector 42 is configured to supply the decay level VRDM as the comparison reference level VREF2 to the comparing unit 43. In other words, the selector 42 is configured to alternately and repeatedly supply the attack level VRAM and the decay level VRDM to the comparing unit 43.

In the embodiment, the comparing unit 43 is configured to compare the level of the input audio signal IN with the comparison reference level VREF2. When the level of the input audio signal IN is greater than the comparison reference level VREF2, the comparing unit 43 is configured to supply a comparison result signal VCMP2 with the logic level 1 to the inverter 44 and the FF 45, respectively. When the level of the input audio signal IN is smaller than the comparison reference level VREF2, the comparing unit 43 is configured to supply a comparison result signal VCMP2 with the logic level 0 to the inverter 44 and the FF 45, respectively.

In the embodiment, as shown in FIG. 3, the FF 45 is configured to capture the comparison result signal VCMP2 at the timing of the rising edge portion ED1 of the inverted clock signal CKV. Further, the FF 45 is configured to supply the comparison result signal VCMP2 as an attack enable signal atken2 to the logic sum gate 5.

It is noted that the attack enable signal atken2 becomes an amplitude reduction instruction for performing the amplitude adjustment to reduce the amplitude only when the attack enable signal atken2 has the logic level 1. Accordingly, when the attack enable signal atken2 has the logic level 1, the amplitude adjusting unit 7 performs the amplitude adjustment to reduce the amplitude. On the other hand, when the attack enable signal atken2 has the logic level 0, the amplitude adjusting unit 7 does not perform the amplitude adjustment to reduce the amplitude.

In the embodiment, the inverter 44 is configured to generate an inverted comparison result signal VVCMP2 having the logic level that is an inverted logic level of the comparison result signal VCMP2, and supply the inverted comparison result signal VVCMP2 to the FF 46.

In the embodiment, as shown in FIG. 3, the FF 46 is configured to capture the inverted comparison result signal VVCMP2 at the timing of the rising edge portion ED2 of the clock signal CK. Further, the FF 46 is configured to supply the inverted comparison result signal VVCMP2 as a decay enable signal dcyen2 to the logic sum gate 6.

It is noted that the inverted comparison result signal VVCMP2 becomes an amplitude augmentation instruction for performing the amplitude adjustment to augment the amplitude only when the inverted comparison result signal VVCMP2 has the logic level 1. Accordingly, when the inverted comparison result signal VVCMP2 has the logic level 1, the amplitude adjusting unit 7 performs the amplitude adjustment to augment the amplitude. On the other hand, when the inverted comparison result signal VVCMP2 has the logic level 0, the amplitude adjusting unit 7 does not perform the amplitude adjustment to augment the amplitude.

In the embodiment, with the configuration described above, the negative polarity side adjustment determining unit 4 compares the level of the input audio signal IN on the negative polarity side thereof with the two reference values, namely, the attack level VRAM and the decay level VRDM in a time sequential manner. Accordingly, it is possible to determine whether the amplitude is to be augmented or reduced.

More specifically, as shown in FIG. 2, when the level of the input audio signal IN on the negative polarity side thereof is greater than the attack level VRAM (that is, the amplitude on the negative polarity side is large), the negative polarity side adjustment determining unit 4 determines that the amplitude of the input audio signal IN is to be reduced. Accordingly, the negative polarity side adjustment determining unit 4 supplies the attack enable signal atken2 with the logic level 1 to the logic sum gate 5 for performing the amplitude adjustment to reduce the amplitude. On the other hand, as shown in FIG. 2, when the level of the input audio signal IN on the negative polarity side thereof is smaller than the decay level VRDM that is smaller than the attack level VRAM by the specific value (that is, the amplitude on the negative polarity side is small), the negative polarity side adjustment determining unit 4 determines that the amplitude of the input audio signal IN is to be augmented. Accordingly, the positive polarity side adjustment determining unit 3 supplies the decay enable signal dcyen2 with the logic level 1 to the logic sum gate 6 for performing the amplitude adjustment to reduce the amplitude.

It is noted that when the level of the input audio signal IN on the negative polarity side thereof is smaller than the attack level VRAM and greater than the decay level VRDM, both the attack enable signal atken2 and the decay enable signal dcyen2 have the logic level 0.

In the embodiment, the logic sum gate 5 is configured to supply an amplitude reduction instruction signal CATK with the logic level 1 to the amplitude adjusting unit 7 for reducing the amplitude when the attack enable signal atken1 supplied from the positive polarity side adjustment determining unit 3 or the attack enable signal atken2 supplied from the negative polarity side adjustment determining unit 4 has the logic level 1. On the other hand, the logic sum gate 5 is configured to supply the amplitude reduction instruction signal CATK with the logic level 0 to the amplitude adjusting unit 7 for not reducing the amplitude when the attack enable signal atken1 supplied from the positive polarity side adjustment determining unit 3 or the attack enable signal atken2 supplied from the negative polarity side adjustment determining unit 4 has the logic level 0.

In the embodiment, the logic sum gate 6 is configured to supply an amplitude augmentation instruction signal CDCY with the logic level 1 to the amplitude adjusting unit 7 for augmenting the amplitude when the decay enable signal dcyen1 supplied from the positive polarity side adjustment determining unit 3 or the decay enable signal dcyen2 supplied from the negative polarity side adjustment determining unit 4 has the logic level 1. On the other hand, the logic sum gate 6 is configured to supply the amplitude augmentation instruction signal CDCY with the logic level 0 to the amplitude adjusting unit 7 for not augmenting the amplitude when the decay enable signal dcyen1 supplied from the positive polarity side adjustment determining unit 3 or the decay enable signal dcyen2 supplied from the negative polarity side adjustment determining unit 4 has the logic level 0.

In the embodiment, the amplitude adjusting unit 7 is configured to perform the amplitude adjustment process on the input audio signal IN to reduce the amplitude thereof to obtain an audio signal OUT when the logic sum gate 5 supplies the amplitude reduction instruction signal CATK with the logic level 1 to the amplitude adjusting unit 7. Further, the amplitude adjusting unit 7 is configured to output the audio signal OUT thus obtained.

On the other hand, the amplitude adjusting unit 7 is configured to perform the amplitude adjustment process on the input audio signal IN to augment the amplitude thereof to obtain the audio signal OUT when the logic sum gate 6 supplies the amplitude augmentation instruction signal CDCY with the logic level 1 to the amplitude adjusting unit 7. Further, the amplitude adjusting unit 7 is configured to output the audio signal OUT thus obtained.

It is noted that when the amplitude reduction instruction signal CATK or the amplitude augmentation instruction signal CDCY has the logic level 0, the amplitude adjusting unit 7 is configured to output the input audio signal IN as the audio signal OUT as is.

In the embodiment, the amplitude adjusting unit 7 may be formed of, for example, a variable gain amplifier. When the logic sum gate 5 supplies the amplitude reduction instruction signal CATK with the logic level 1 to the amplitude adjusting unit 7, the amplitude adjusting unit 7 is configured to reduce a gain thereof stepwise. On the other hand, when the logic sum gate 6 supplies the amplitude augmentation instruction signal CDCY with the logic level 1 to the amplitude adjusting unit 7, the amplitude adjusting unit 7 is configured to increase the gain thereof stepwise. When the amplitude reduction instruction signal CATK or the amplitude augmentation instruction signal CDCY has the logic level 0, the amplitude adjusting unit 7 is configured to maintain the gain thereof at one.

Figure 4:
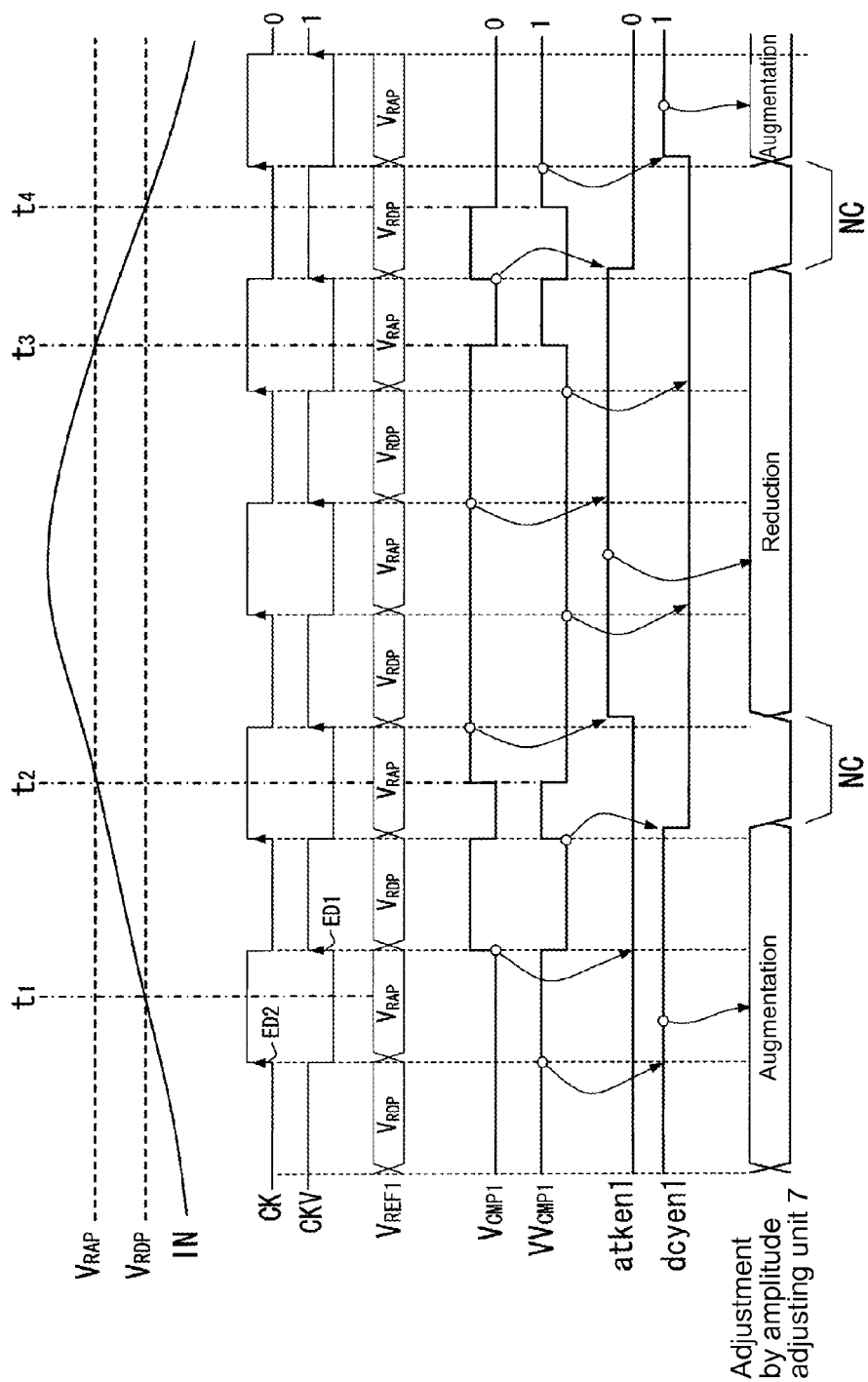
FIG. 4 is a time chart No. 3 showing the operation of the automatic audio signal level adjustment circuit according to the embodiment of the present invention.

An operation of the automatic audio signal level adjustment circuit having the configuration described above will be explained next. FIG. 4 is a time chart No. 3 showing the operation of the automatic audio signal level adjustment circuit according to the embodiment of the present invention. In FIG. 4, the operation of the automatic audio signal level adjustment circuit is illustrated in a level transition period of the input audio signal IN on the positive polarity side thereof.

As shown in FIG. 4, in a level rising period of the input audio signal IN, before the level of the input audio signal IN exceeds the decay level VRDP, that is, just before a timing t1, the level of the input audio signal IN is smaller than both the attack level VRAP and the decay level VRDP.

As shown in FIG. 4, at the timing t1, the comparison reference level VREF1 used by the comparing unit 33 as the reference value is the attack level VRAP. Accordingly, until the level of the input audio signal IN exceeds the attack level VRAP, the comparing unit 33 continues to generate the comparison result signal VCMP1 with the logic level 0.

In the next step, as shown in FIG. 4, when the comparison reference level VREF1 is switched from the attack level VRAP to the decay level VRDP, the comparing unit 33 compares the level of the input audio signal IN with the decay level VRDP. At this moment, after the timing t1, the level of the input audio signal IN becomes greater than the decay level VRDP. Accordingly, the comparing unit 33 switches the logic level 0 of the comparison result signal VCMP1 to the logic level 1.

In the next step, when the comparison reference level VREF1 is switched from the decay level VRDP to the attack level VRAP, the comparing unit 33 generates the comparison result signal VCMP1 with the logic level 0 until the level of the input audio signal IN exceeds the attack level VRAP.

As shown in FIG. 4, at a timing t1, when the level of the input audio signal IN exceeds the attack level VRAP, the comparing unit 33 switches the logic level 1 of the comparison result signal VCMP1 to the logic level 0. In the next step, the comparing unit 33 continues to generate the comparison result signal VCMP1 with the logic level 1 until a timing t3. At the timing t3, the level of the input audio signal IN becomes smaller than the attack level VRAP, and the comparison reference level VREF1 becomes the attack level VRAP.

As shown in FIG. 4, at a timing t4, the level of the input audio signal IN reaches the decay level VRDP. During the period of time from the timing t3 to the timing t4, when the comparison reference level VREF1 is the attack level VRAP, the comparing unit 33 generates the comparison result signal VCMP1 with the logic level 0. When the comparison reference level VREF1 is the decay level VRDP, the comparing unit 33 generates the comparison result signal VCMP1 with the logic level 1. After the timing t4, the level of the input audio signal IN becomes smaller than both the attack level VRAP and the decay level VRDP. Accordingly, the comparing unit 33 generates the comparison result signal VCMP1 with the logic level 0.

As described above, in the level transition period of the input audio signal IN on the positive polarity side thereof (from the timing t1 to the timing t4), the comparing unit 33 generates the comparison result signal VCMP1 with the logic level switching as shown in FIG. 4.

In the embodiment, the FF 35 captures the comparison result signal VCMP1 at the timing of the rising edge portion ED1 of the inverted clock signal CKV. Accordingly, the FF 35 obtains the attack enable signal atken1 instructing whether the reduction adjustment of the amplitude is performed as shown in FIG. 4. Further, the FF 36 captures the inverted comparison result signal VVCMP1 with the logic level that is the inverted one of the logic level of the comparison result signal VCMP1 at the timing of the rising edge portion ED2 of the clock signal CK. Accordingly, the FF 36 obtains the decay enable signal dcyen1 instructing whether the augmentation adjustment of the amplitude is performed as shown in FIG. 4.

Accordingly, in the embodiment, when the decay enable signal dcyen1 has the logic level 1, the amplitude adjusting unit 7 performs the amplitude adjustment to augment the amplitude of the input audio signal IN. On the other hand, when the attack enable signal atken1 has the logic level 1, the amplitude adjusting unit 7 performs the amplitude adjustment to reduce the amplitude of the input audio signal IN.

In the embodiment, in the level transition period of the input audio signal IN on the negative polarity side thereof, the negative polarity side adjustment determining unit 4 performs the operation similar to that of the positive polarity side adjustment determining unit 3.

More specifically, as shown in FIG. 2, in the level transition period of the input audio signal IN on the positive polarity side thereof, the positive polarity side adjustment determining unit 3 generates the attack enable signal atken1 with the logic level 1 and the decay enable signal dcyen1 with the logic level 0.

On the other hand, in the level transition period of the input audio signal IN on the negative polarity side thereof, the negative polarity side adjustment determining unit 4 generates the attack enable signal atken2 with the logic level 1 and the decay enable signal dcyen2 with the logic level 0.

In the embodiment, when the attack enable signal atken1 or the attack enable signal atken2 has the logic level 1, the amplitude adjustment process is performed to reduce the amplitude of the input audio signal IN. On the other hand, when the decay enable signal dcyen1 or the decay enable signal dcyen2 has the logic level 1, the amplitude adjustment process is performed to augment the amplitude of the input audio signal IN.

As described above, in the automatic audio signal level adjustment circuit shown in FIG. 1, when the input audio signal IN has a large amplitude and the level thereof exceeds the attack level VRAP (VRAM) as the first reference value, the amplitude adjustment is performed to reduce the amplitude of the input audio signal IN.

On the other hand, when the level of the input audio signal IN is smaller than the decay level VRDP (VRDM) as the second reference value smaller than the first reference value, the amplitude adjustment is performed to augment the amplitude of the input audio signal IN. Further, when the level of the input audio signal IN is smaller than the attack level VRAP (VRAM) and greater than the decay level VRDP (VRDM), the amplitude adjustment is not performed, and the input audio signal IN is output as is.

In the amplitude adjustment operation, as shown in FIG. 4, when the amplitude adjustment operation of the amplitude adjusting unit 7 is switched from the reduction adjustment of the amplitude to the augmentation adjustment of the amplitude, or from the augmentation adjustment of the amplitude to the reduction adjustment of the amplitude, a period NC is created, in which the amplitude adjustment operation is not performed. Accordingly, it is possible to reduce a noise generated due to the rapid switching between the reduction adjustment of the amplitude and the augmentation adjustment of the amplitude during the amplitude adjustment operation of the amplitude adjusting unit 7.

Further, in the automatic audio signal level adjustment circuit shown in FIG. 1, the selector 32 and the selector 42 are configured to alternately and repeatedly supply the two reference values, that are, the attack level (VRAP, VRAM) and the decay level (VRDP, VRDM), to the comparing unit 33 and the comparing unit 43, respectively. Accordingly, it is configured such that the level of the input audio signal IN is compared with the two reference values in the time sequential manner.

More specifically, in the time sequential operation, one of the comparing unit 33 and the comparing unit 43 compares the level of the input audio signal IN with the attack level (VRAP, VRAM), and compares the level of the input audio signal IN with the decay level (VRDP, VRDM).

Accordingly, as opposed to the configuration, in which two separate comparing units compares the level of the input audio signal IN with the attack level, and compares the level of the input audio signal IN with the decay level, it is possible to reduce the size of the automatic audio signal level adjustment circuit. Further, it is possible to minimize a variance in an offset error between the two separate comparing units when the two separate comparing units are provided. Accordingly, it is possible to perform the amplitude adjustment to accurately maintain the level of the input audio signal with the specific amplitude adjustment range VATK.

The disclosure of Japanese Patent Application No. 2010-285711, filed on Dec. 22, 2010, is incorporated in the application by reference.

While the invention has been explained with reference to the specific embodiments of the invention, the explanation is illustrative and the invention is limited only by the appended claims.

What is claimed is:

1. An automatic audio signal level adjustment circuit capable of automatically adjusting a level of an input audio signal within a specific range, comprising:

an amplitude adjustment determining circuit unit configured to generate an amplitude reduction instruction when the level of the input audio signal is greater than a first reference value corresponding to a maximum value of the specific range, said amplitude adjustment determining circuit unit being configured to generate an amplitude augmentation instruction when the level of the input audio signal is smaller than a second reference value that is smaller than the first reference value by a specific value; and an amplitude adjusting circuit unit configured to output an output audio signal having a level reduced from the level of the input audio signal when the amplitude adjustment determining circuit unit generates the amplitude reduction instruction, said amplitude adjusting circuit unit being configured to output an output audio signal having a level augmented from the level of the input audio signal when the amplitude adjustment determining circuit unit generates the amplitude augmentation instruction, said amplitude adjusting circuit unit being configured to output an output audio signal equal to the input audio signal when the amplitude adjustment determining circuit unit does not generate the amplitude reduction instruction and the amplitude augmentation instruction, wherein said amplitude adjustment determining circuit unit includes a reference value alternate transmission circuit unit configured to alternately transmit the first reference value and the second reference value, and an amplitude adjustment instruction generating circuit unit configured to compare the level of the input audio signal with a comparison reference value to generate one of the amplitude reduction instruction and the amplitude augmentation instruction, and said amplitude adjustment instruction generating circuit unit includes:

a comparing circuit unit configured to generate a first comparison result signal having a first logic value when the level of the input audio signal is greater than the first reference value, and to generate a second comparison result signal having a second logic value equal to an inverted value of the first logic value when the level of the input audio signal is smaller than the second reference value;

a first flip-flop circuit unit configured to capture the first comparison result signal at a timing when the first reference value is transmitted, and to output the first comparison result signal as an amplitude reduction instruction signal; and a second flip-flop circuit unit configured to capture the second comparison result signal at a timing when the second reference value is transmitted, and to output the second comparison result signal as an amplitude augmentation instruction signal.

2. The automatic audio signal level adjustment circuit according to claim 1, wherein said reference value alternate transmission circuit unit includes a reference value generating unit configured to generate the first reference value and the second reference value, and a selector circuit unit configured to repeatedly and alternately select one of the first reference value and the second reference value according to a cycle of a clock signal to transmit the one of the first reference value and the second reference value as the comparison reference value.

3. The automatic audio signal level adjustment circuit according to claim 1, wherein said amplitude adjusting circuit unit is configured to reduce the level of the input audio signal when the amplitude reduction instruction signal has the first logic value, said amplitude adjusting circuit unit being configured to augment the level of the input audio signal when the amplitude augmentation instruction signal has the first logic value, said amplitude adjusting circuit unit being configured to output the output audio signal equal to the input audio signal when both the amplitude reduction instruction signal and the amplitude augmentation instruction signal have the second logic value.

4. The automatic audio signal level adjustment circuit according to claim 1, further comprising an inverter circuit unit configured to invert the logic value of the first comparison result signal to generate the second comparison result signal.

5. The automatic audio signal level adjustment circuit according to claim 2, wherein said reference value alternate transmission circuit unit further includes a clock generating circuit unit configured to generate the clock signal having one of the first logic value and the second logic value alternately in a specific frequency and an inverted clock signal having an inverted logic value of the clock signal, said selector circuit unit being configured to transmit the first reference value when the clock signal has the first logic value, said selector circuit unit being configured to transmit the second reference value when the clock signal has the second logic value.

6. The automatic audio signal level adjustment circuit according to claim 1, wherein said amplitude adjustment determining circuit unit includes:

a positive polarity side determining circuit unit configured to output the amplitude reduction instruction when the level of the input audio signal is greater than the first reference value corresponding to the maximum value of the specific range having a positive polarity, and to output the amplitude augmentation instruction when the level of the input audio signal is smaller than the second reference value that is smaller than the first reference value by the specific value and having the positive polarity; and a negative polarity side determining circuit unit configured to output the amplitude reduction instruction when the level of the input audio signal is smaller than a third reference value corresponding to a minimum value of the specific range having a negative polarity, and to output the amplitude augmentation instruction when the level of the input audio signal is greater than a fourth reference value greater than the third reference value by a specific value and having the negative polarity.

7. An automatic audio signal level adjustment circuit capable of automatically adjusting a level an amplitude of an input audio signal within a specific range, comprising:

an amplitude adjustment determining circuit unit configured to generate an amplitude reduction instruction when the amplitude of the input audio signal is greater than a first reference value, said amplitude adjustment determining circuit unit being configured to generate an amplitude augmentation instruction when the amplitude of the input audio signal is smaller than a second reference value that has an absolute value smaller than that of the first reference value by a specific value; and an amplitude adjusting circuit unit configured to output an output audio signal having an amplitude reduced from the amplitude of the input audio signal when the amplitude adjustment determining circuit unit generates the amplitude reduction instruction, said amplitude adjusting circuit unit being configured to output an output audio signal having an amplitude augmented from the amplitude of the input audio signal when the amplitude adjustment determining circuit unit generates the amplitude augmentation instruction, said amplitude adjusting circuit unit being configured to output an output audio signal equal to the input audio signal when the amplitude adjustment determining circuit unit does not generate the amplitude reduction instruction and the amplitude augmentation instruction, wherein said amplitude adjustment determining circuit unit is configured to generate the amplitude reduction instruction when the amplitude of the input audio signal other than a peak level thereof is greater than the first reference value, and said amplitude adjustment determining circuit unit is configured to generate the amplitude augmentation instruction when the amplitude of the input audio signal other than the peak level thereof is smaller than the second reference value.

* * * * *